United States Patent [19]

Deinhardt et al.

[11] Patent Number: 5,043,847
[45] Date of Patent: Aug. 27, 1991

[54] BOX SHAPED ELECTRICAL ASSEMBLY

[75] Inventors: Guenther Deinhardt; Otto Meusel, Erlangen; Heinz-Dieter Muench, Amberg; Siegfried Seidel, Amberg, all of Fed. Rep. of Germany

[73] Assignee: Siemens Aktiengesellschaft, Berlin and Munich, Fed. Rep. of Germany

[21] Appl. No.: 469,698

[22] Filed: Jan. 22, 1990

Related U.S. Application Data

[63] Continuation of Ser. No. 736,228, May 20, 1985, abandoned.

[30] Foreign Application Priority Data

May 21, 1984 [DE] Fed. Rep. of Germany ....... 3418844

[51] Int. Cl.⁵ .............................................. H05K 1/14
[52] U.S. Cl. .................................... 361/395; 361/391; 361/393; 361/426
[58] Field of Search ............ 339/17 LM, 17 M, 17 N, 339/176 MP; 361/391, 394, 393, 395, 399, 413, 415, 426

[56] References Cited

U.S. PATENT DOCUMENTS

| | | | |
|---|---|---|---|
| 3,992,654 | 11/1976 | Springer et al. | 361/415 |
| 4,151,480 | 4/1979 | Struger et al. | 361/415 |
| 4,575,785 | 3/1986 | Lerude et al. | 362/226 |

FOREIGN PATENT DOCUMENTS

| | | |
|---|---|---|
| 0133396 | 2/1985 | European Pat. Off. . |
| 2209786 | 9/1973 | Fed. Rep. of Germany ...... 361/415 |
| 7622134 | 12/1976 | Fed. Rep. of Germany . |
| 2714168 | 10/1978 | Fed. Rep. of Germany . |
| 2718442 | 11/1978 | Fed. Rep. of Germany . |
| 3014234 | 11/1980 | Fed. Rep. of Germany . |
| 2928668 | 12/1981 | Fed. Rep. of Germany . |
| 2904012 | 9/1983 | Fed. Rep. of Germany . |
| 1035318 | 7/1966 | United Kingdom . |

Primary Examiner—Gregory D. Thompson
Attorney, Agent, or Firm—Peter A. Luccarelli, Jr.

[57] ABSTRACT

The invention consists of a box-shaped electrical assembly with a frontal cover and screw connections for the connection of leads accessible from the front. The cable lead openings to the screw connections are located in an open-to-the-front, longitudinal channel located at the front of the assembly. The cover acts as a labeling plate and also functions as a cover for the longitudinal channel and for the screw connections. The screw connections electrically connect an external cable to a plug unit subassembly. The plug unit is connectable with a circuit board enclosed within the assembly. The plug unit is provided with a pivotal axis, and is adapted for connecting to a plug strip that is mechanically and electronically connected to the circuit board.

9 Claims, 6 Drawing Sheets

BOX SHAPED ELECTRICAL ASSEMBLY

CROSS-REFERENCE TO RELATED APPLICATION

This is a continuation of Ser. No. 06/736,228 filed May 20, 1985, now abandoned.

BACKGROUND OF THE INVENTION

The invention relates to the field of housings for electrical circuit boards and more particularly to a box-shaped, electronic circuit assembly with a front cover and screw terminal connections for external cable located in the front of the assembly, whereby the individual cable lead access holes for the screw terminals are accessed by means of a frontal longitudinal channel.

An assembly similar to this type is known from Federal Republic of Germany published application 2,904,012. In that assembly forward projecting mechanical caps are mounted solidly, and the assembly is equipped with openings allowing the insertion of terminal plugs. On the left front side a lateral connection block is provided containing a multipolar contact strip with screw terminals for the reception of external leads. Each of these screw terminals directs the cap inwards towards the contacts, which connect at insertion with the appropriate mating contacts mounted laterally on the contact strip. The cover is solidly attached to the contact strip. In that assembly, however, the lead channel is not shielded by its cover.

The above-described arrangement can be improved, by keeping the easy frontal connection feature and by adding enough room for labeling. Further, for the purpose of clear visual access, the assemblies should be able to be mounted immediately next to each other, with adjacent flat sides, while retaining the easy plug-in connection feature. Lastly, a reliable and precise mechanism for effecting a plug connection without incurring undue additional costs is desired.

These objects are achieved when: a longitudinal cable channel is provided at the front of the assembly; a cover assembly includes a labeling surface; the cover assembly further shields the longitudinal channel and screw terminals; the screw terminals are connectable by means of a plug unit to an assembly containing a printed-circuit; and, a plug rail of the plug unit is connected electrically and mechanically to the circuit board and is equipped with a pivot for the plug unit.

In the arrangement known from U.S. Pat. No. 3,992,654, the pressure of the pivoting plug unit is absorbed by the outer frame, which means that the circuit boards, which are each attached to the frame, are forced to make an undesired relative movement with respect to the pivot swivel axis.

It is an object of this invention to make it impossible for there to be an undesired relative movement between a circuit board and the pivot axis of a plug unit through connecting parts. This is accomplished by the attachment of the pivot axis to the circuit boards.

The locating of a cable receiving space in a longitudinal channel of the plug unit has been shown to have advantages when the design allows the side wall opposite to the screw terminals connectors to be removed. A free access path for insertion of the leads is hereby preserved. In the invention shown in U.S. Pat. No. 3,992,654, a separate cover must be removed and the accessibility to the screw terminals is reduced because of the attachment angle of that separate cover.

In order to facilitate the insertion and the removal of the electrical lead unit, it is desirable to provide an attachment screw mounted on an axially unmovable bearing which is positioned on the opposite side of the electrical unit and which can be screwed into a thread in the molding of the plug unit.

A certain arrangement in the markings for the LEDs in the labeling panel is obtained when the longitudinal channel is flanked by screw connections and bordering LEDs, whereby the labeling panel, when in operation, is directly next to the LEDs. Since the LEDs should be more or less at the same height as the screw connections, but the circuit board can only start behind the screw connections, it is desirable to arrange the LEDs in a holder which is electrically and mechanically connected to the circuit board.

It is desirable to have a procedure to put the LEDs in place in one single action during the assembly of the circuit board.

To make sure that adjustment and testing is only performed by qualified personnel and in order to have the surface subassemblies always in an electrically isolated state, it is desirable to provide a module which is behind the plug unit as seen from the front and accessible after the plug unit has been pivoted away, which is accessible from the front attached to the assemblies for the fuse changing and/or adjusting of operation and measurement values.

To eliminate the outside stresses which the module might be subjected to, for example, by the changing of fuses in the circuit board, it is further advantageous to connect the module to the circuit board with dovetail connections and to depress it fully against its stops.

Accordingly, it is also an object of this invention to provide a box-shaped electrical assembly with improved accessibility for construction and repair. It is a further object of this invention to provide an attachment screw mounted on an axially rigid bearing to facilitate the insertion and the removal of the electrical unit. It is another object of this invention to arrange the LEDs in a holder that is electrically and mechanically connected to the circuit board of the assembly, and to assemble the LEDs in place by a single-action procedure. It is another object of this invention to provide a fusing and/or adjustment subassembly module mounted behind the plug unit for service and adjustment by qualified personnel.

SUMMARY OF THE INVENTION

Briefly stated, in accordance with one aspect of the invention, the foregoing objects are achieved by providing a box-shaped electrical assembly which has at its front a plug unit having a frontal cover and frontally accessible screw terminal cable. The cable and its leads run along and within a longitudinal channel at the front of the electrical assembly. The cover assembly covers both the longitudinal channel and the screw connections. The cover assembly further includes a labeling surface. The screw connections embodied in the plug unit are connected to a front contact blade strip of the circuit board of electrical assembly. The mating plug strip is connected to the circuit board and has a threaded hole for making a secure connection with the plug unit after the unit has been pivoted into engagement.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings.

DETAILED DESCRIPTION OF A PREFERRED EMBODIMENT

Figure 1:
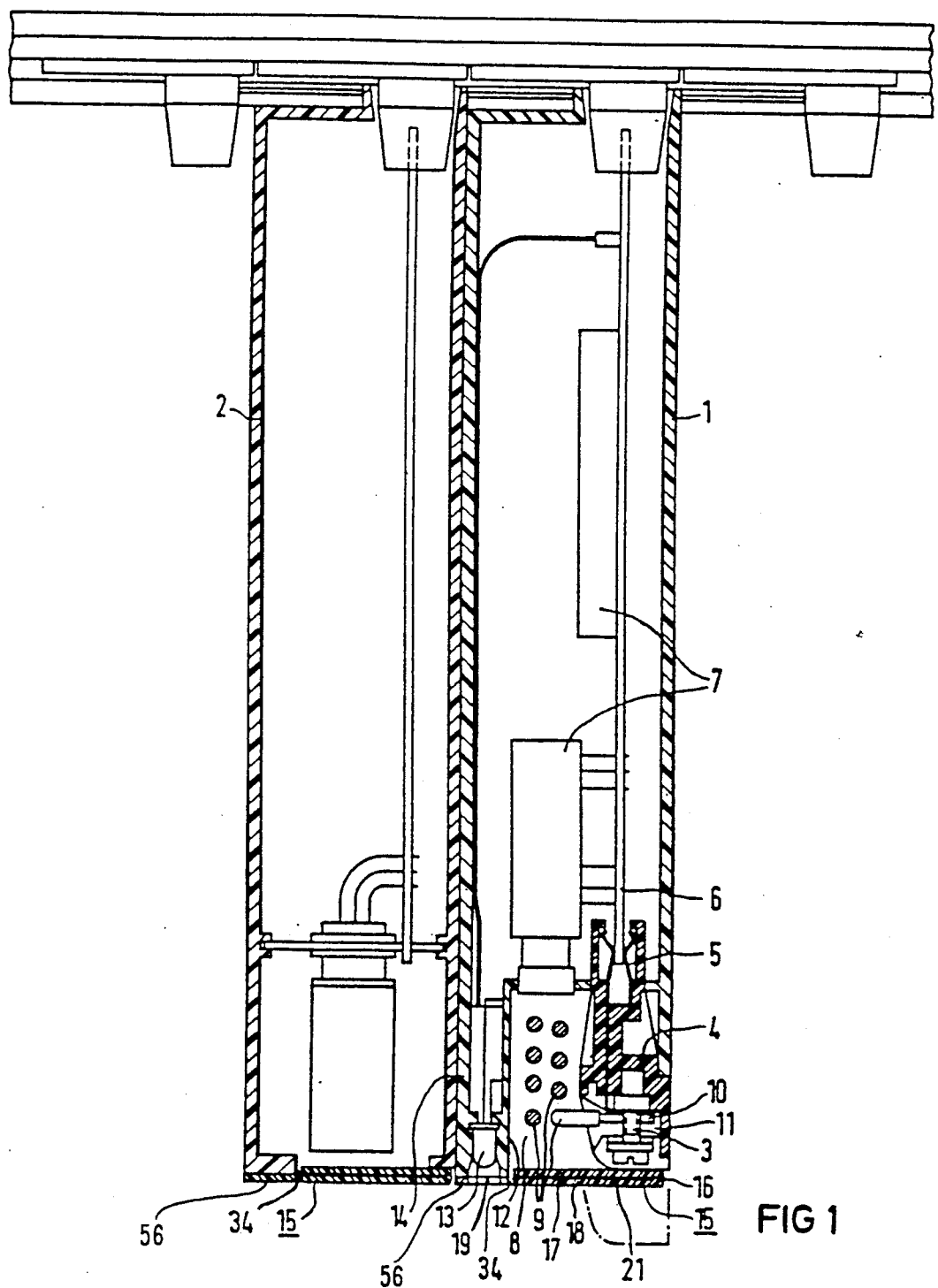
FIG. 1 diagrammatically depicts two surface assemblies in side view, partially in cross-section.

As evident the surface assemblies 1 and 2 in FIG. 1, assembly 1 is equipped with screw terminal block 3, which is assembled with plug unit 4 and which makes the spring contacts 5 connect with the circuit board 6. The electronic components 7 are attached to the circuit board 6. Circuit board 6 is held in position in the assemblies in similar fashion, and is provided with additional plug connections to the internal circuitry from several interconnected assemblies on the side opposite to the front. Right next to the screw terminal block 3 is a channel 8, in which the leads 9 can be fed. The ends 10 of the leads 9 are stripped of insulation and inserted in the connection lead openings in order to be clamped into the screw terminal. Only a single end 10 is shown in FIG. 1 to avoid crowding. Channel 8 is bordered on the opposite side by partition 12, behind which the LEDs 13 are situated, which, as wired, are used as indicators of the switching status of the assemblies. They can be assembled with circuit board 6 as one single unit and can be wired on the circuit board, so that the LEDs 13 are positioned at the exterior wall 14 of the box shaped housing of the assembly 1. The cover assembly 15 consists of a support plate 56 which is provided with openings 19 to reveal the LEDs 13 and which is removably fastened to the exterior wall 14, a cover plate 18 which is connected along one edge to the support plate 56 by means of a hinge 34, and a labeling plate 17 which is attached by a hinge 16 to an opposite edge of the cover plate 18 and folded against it. The cover plate 18 has an opening 22 which define labeling fields on the labeling plate 17. The cover plate 18 and labeling plate 17 may be fastened to each other by snaps (not shown) and are pivoted together by the hinge 34 in order to reach the vertical cable shaft. The complete cover assembly 15 can be removed when changing the surface 1,2 assemblies, and can be snapped onto the new assembly. This eliminates the need for new labeling. Markings can also be provided on the inside of the labeling plate 17 as necessary.

Figure 5:
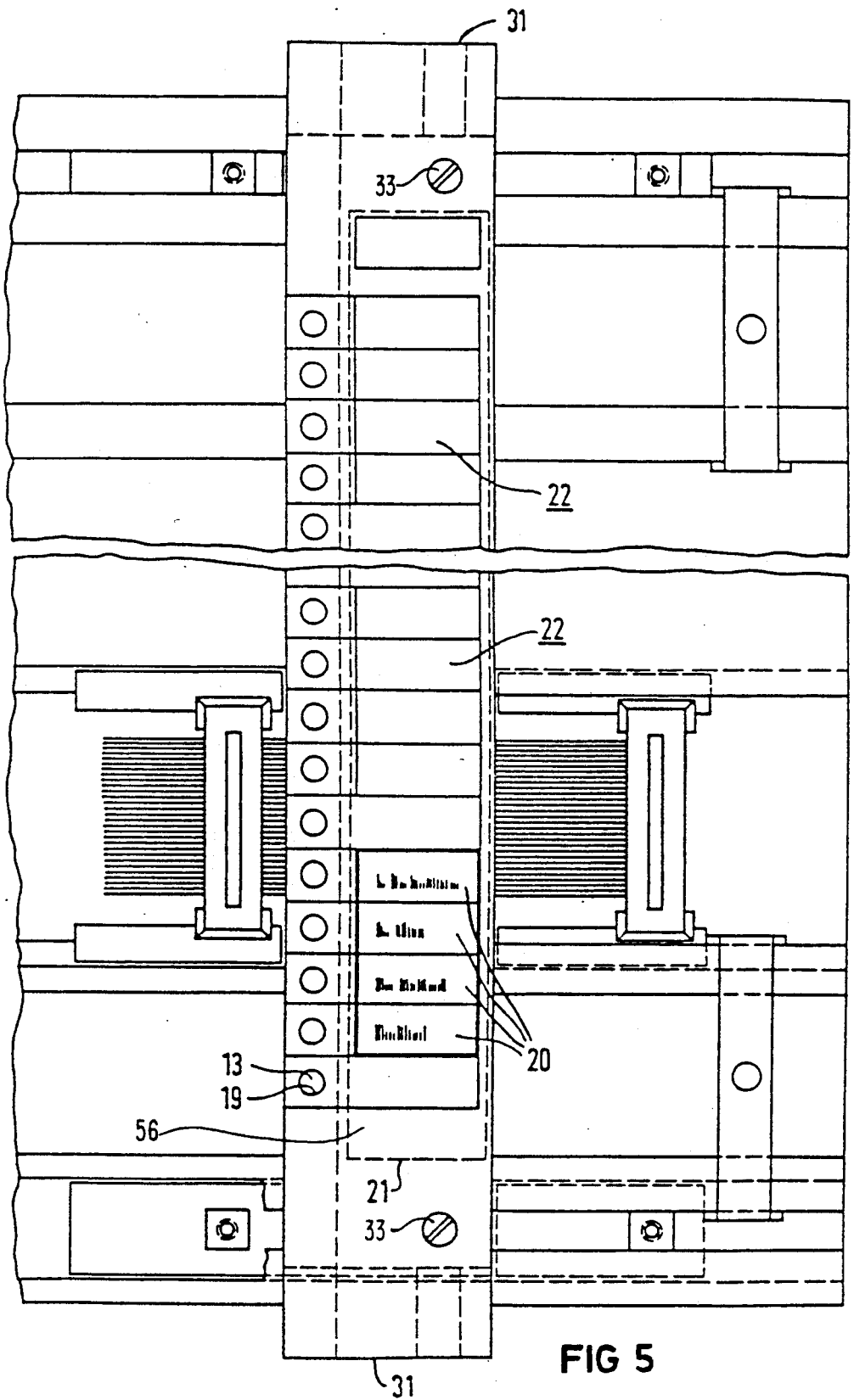
FIG. 5 is a top view of the labeling plate attached to the assembly.

FIG. 5 shows the presence of openings 19 in support plate through which the LEDs are visible. Furthermore, there are labeling fields 20 on a labelling strip 21 clasped between plates 17 and 18. In another embodiment where field openings 22 are eliminated, cover plate 18 can act as labeling area. Cover plate 18 can also be made transparent, so that the markings on the labeling strip can be seen through cover plate 18. The elimination of field openings 22 has the advantage that the assembly can be labeled by hand from the outside without having to open cover plate 18. The assembly 2 does not contain a screw block 3, but makes electrical contact only through the necessary internal firing, so that the labeling plate 15 can be made without labeling areas and without openings 19 for the LEDs.

Figure 2:
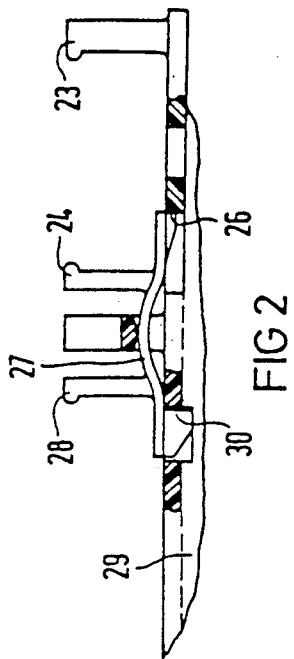
FIG. 2 diagrammatically depicts the reach of the terminal board in the case of a removed terminal board, again partly in cross-section.
Figure 3:
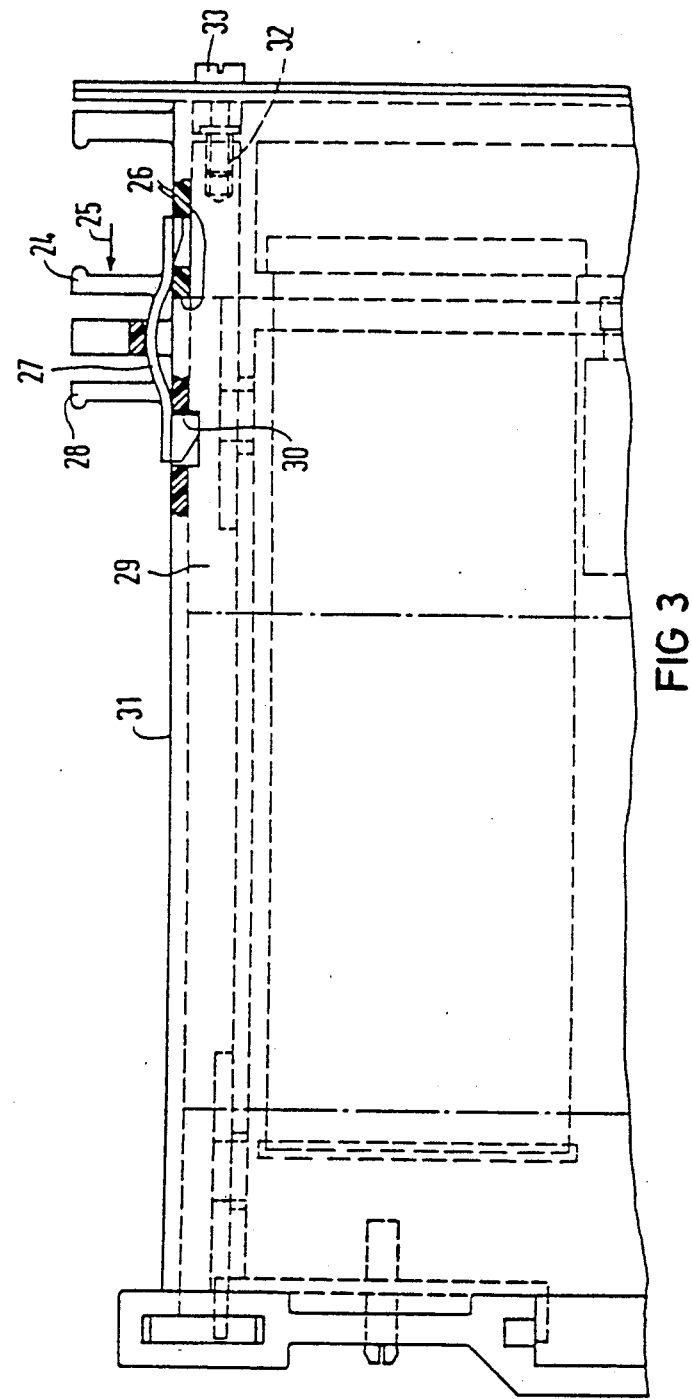
FIG. 3 diagrammatically depicts the same arrangement as shown in FIG. 2, only with a terminal board inserted.
Figure 4:
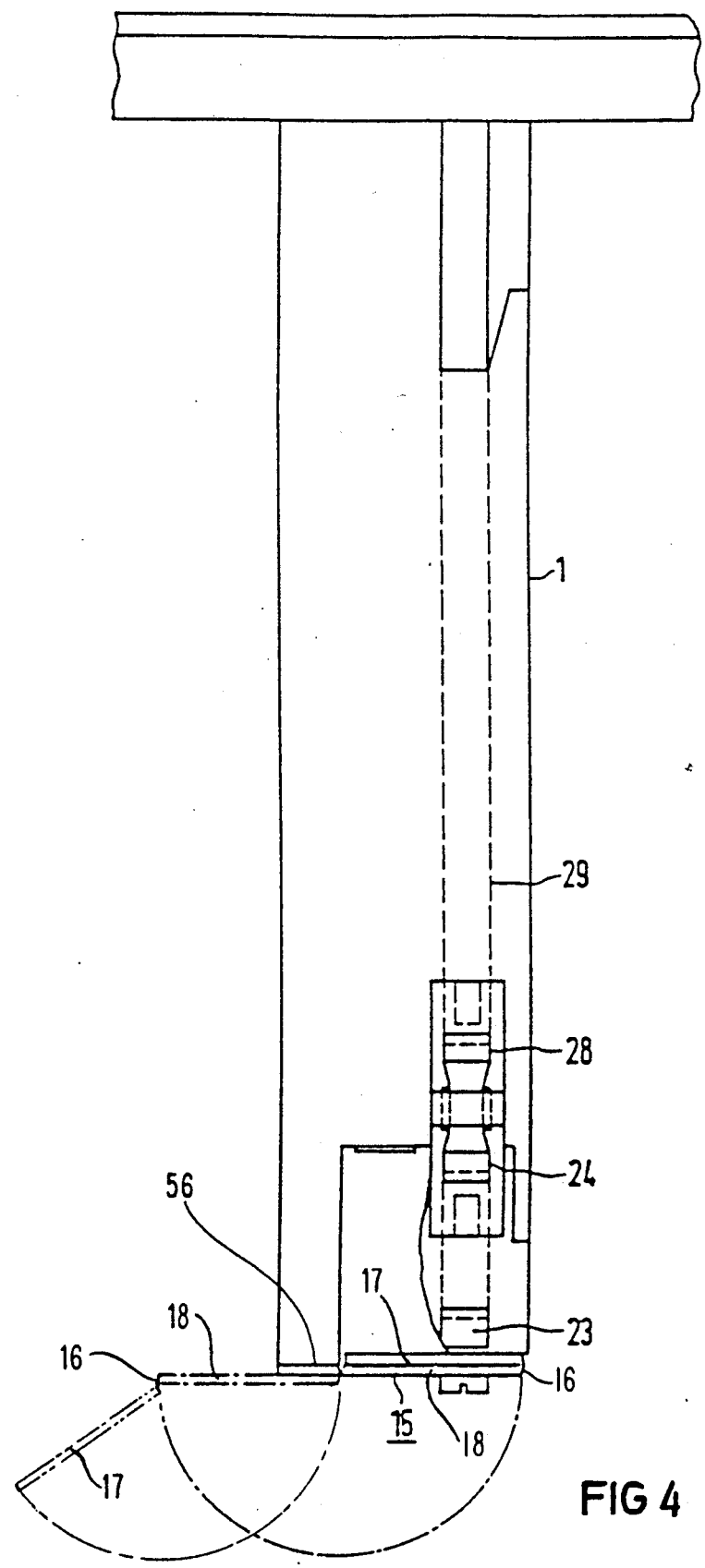
FIG. 4 is the arrangement shown in FIG. 3, turned 90 degrees.

In order to facilitate the insertion of the ends 10 into the connection lead passage holes 11, the plug unit 4 can be pulled out toward the front as indicated by the dashed lines on FIG. 1 and it can also be secured in this location. The handles 23 which are connected to the top surface and to the plug unit can serve this purpose as shown by FIG. 2 and FIG. 3. Should the plug unit be moved from the pre-wiring location shown in FIG. 2 to the one shown in FIG. 3, then the connection 26 can be disconnected through pressure on a lever in the direction of arrow 25, and the plug unit 4 can be inserted by means of handles 23 to create a connection between the spring contacts 5 and the terminals of the circuit board 6. The stop lever 24 can be made in a unit with a stop element 27, which is secured to the stop connection 30 by a guide rod. The stop connection can be disconnected by means of a disconnect lever 28. As shown in FIG. 3, the assemblies are equipped at both end surfaces 31 with a guide rod 29 having threaded holes 32, into which the securing screw 33 for the cover assembly are installed. If the guide rods are metallic, they can also be used for shielding purposes, for example by a ground connection of the LP-shielding surfaces through sliding spring contacts riveted to the guide rods. With remote assemblies the guide rods can be used for the attachment of the front plugs, so that these do not hang freely on their cables. The positioning and the arrangement of the guide rod and the location of the bus cable connections can for example be aided by a striker in place of a securing screw 33 which snaps shut only on the sides.

Figure 6:
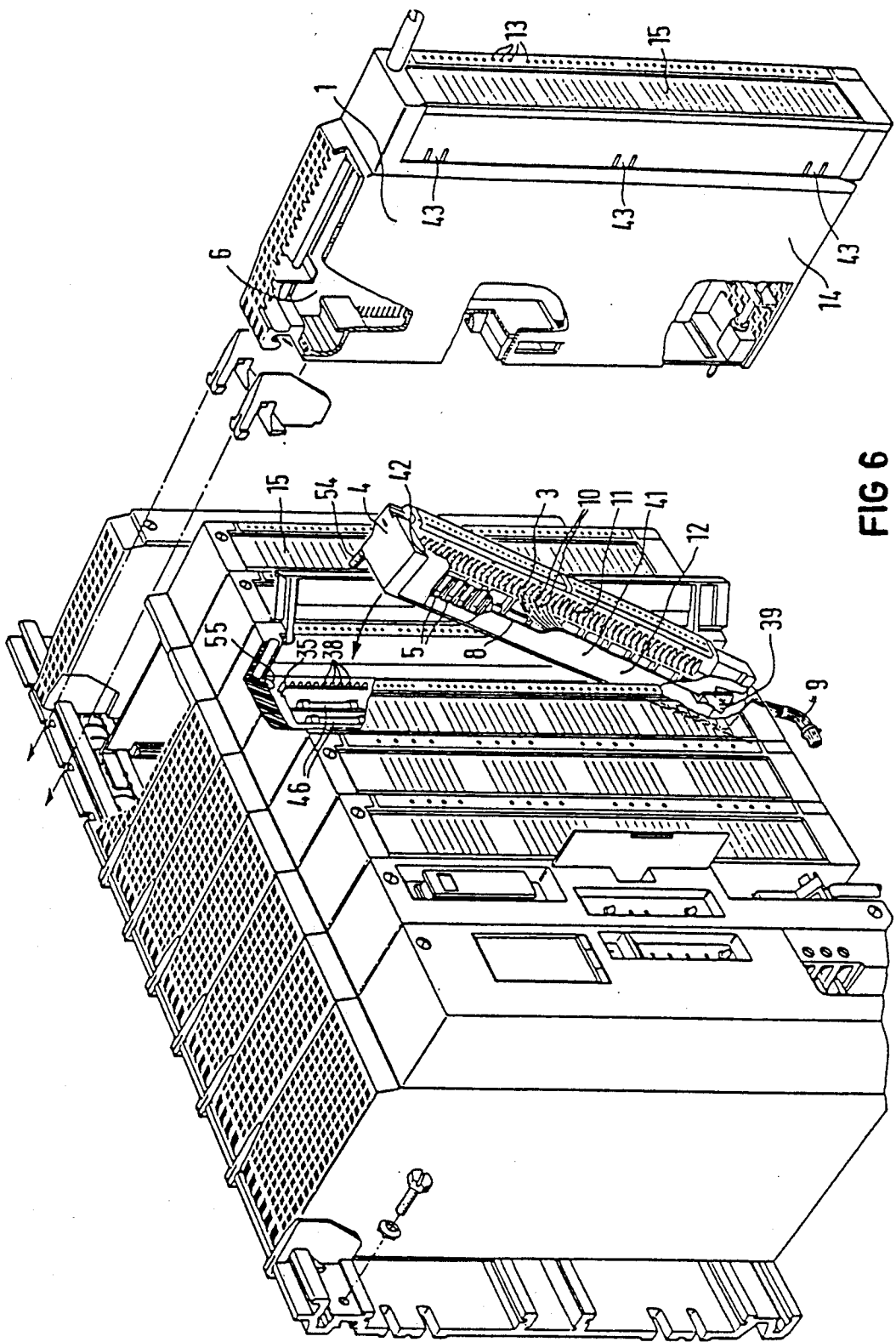
FIG. 6 is a diagrammatic perspective view of a series of assemblies.
Figure 7:
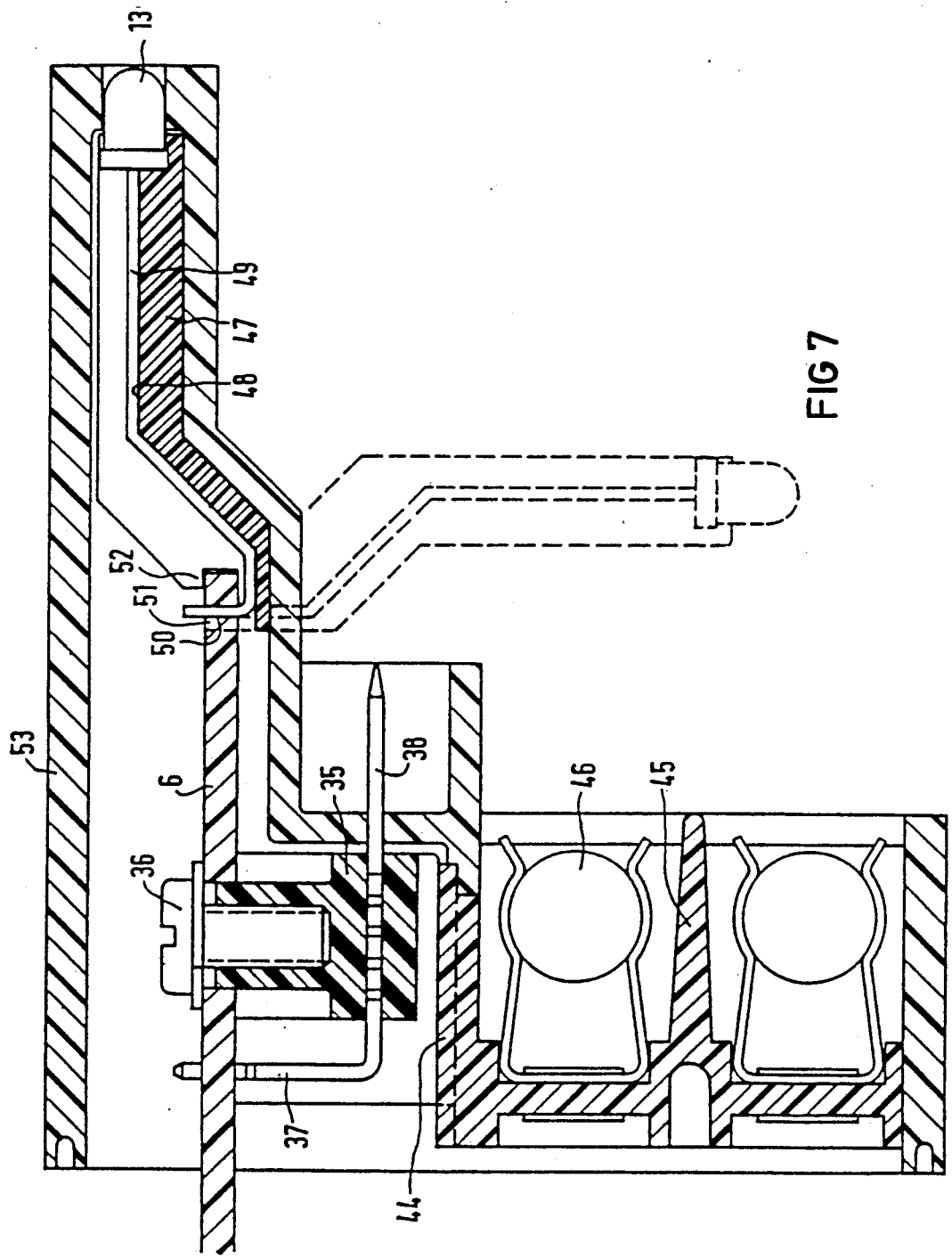
FIG. 7 is a drawing of a single component in the area of the connection between the plug unit and the circuit board, as well as a module and the LED indications in position.

As can be seen in the FIG. 6 and FIG. 7, on the side of the circuit board 6, side of the plug unit 4, a contact blade strip 35 has been provided, which is attached solidly to circuit board 6—as can be seen in FIG. 7—by means of screws 36. The contact blade strip 35 carries the connection terminals 37 which have to be connected electrically to the wiring of the circuit board 6, and which cross over into the connection blades 38. The blades cooperate with the spring contacts 5 of plug unit 4 when the plug unit is in the inserted position. The contact springs 5 in turn are connected electrically by screw connections 3 of plug unit 4, preferably made as a die stamped piece. In the embodiment shown in FIGS. 6 and 7, the plug unit 4 is designed to pivot about a pivot 39 which is fixed to the contact blade strip 35. The plug unit 4 is easily attachable to the contact blade strip 35 by simple connecting hooks, thereby creating a pivot axis to make it possible to rotate the plug unit in the direction of the arrow. The circuit board stays practically free from any mechanical tension, since the pivot is mounted on the contact blade strip 35, eliminating thereby the previous breaks of the leads on the circuit board 6.

In order to also allow the easy insertion of connection leads 9 with the ends 10 into the connection lead openings in the assemblies illustrated by FIG. 6 and 7, the side wall 41 of the rotating plug unit 4 is removable. It is inserted into groove 42 of the casing of the plug unit 4 and secured by means of projections 43. With the help of the details shown in FIG. 1 through 4, one is able to visualize the securing device. Since in the assembly shown in FIG. 6 and 7 the terminal clock 3 is positioned together with the LEDs on one side of the channel 8, one is able to recognize the direct relation between the LEDs and the screw connections. When the cover assembly 15 is in the opened position, the inside of the labeling plate 17 is available for labeling purposes. In the closed position, the cover assembly 15, attached in an articulated fashion by means of hinge 34, covers the screw connections of the plug unit. It is possible to attach a module 45 with a dovetail connection 44 to the contact blade strip 35 in such a way that after pivoting the plug unit 4, it is possible to access the assembly from the front. Fuses 46, replaceable from the front, are represented in the embodiment of FIG. 7 as an example. Instead of a module 45 providing fuse protection, it is possible to insert a different type of module for adjusting the operating and measurement values of the equipment.

As FIG. 7 shows, in order to gain room for the plug connections between the contact blade strip 35 and the plug unit, 4, the LEDs 13 are arranged on the circuit board in such a manner that they will also be immersed at the soldering of the circuit board in an immersion bath. In order to create simple mechanical and electrical connection possibilities, the LEDs are fitted into holder 47, which is equipped with grooves 48 in which the connection wires 49 for the LEDs 13 will fit. The ends of the connection wires 49 will be inserted in corresponding connection openings 50 on the circuit board. The holder has breakable studs 51, which are inserted into corresponding notches on the circuit board, without thereby creating an electrical connection. The layer of the holder 47 is shown as hatched in FIG. 7. Since the LEDs are now located on the other side of circuit board 6, the circuit board can now be soldered to create the connections for the connection wires 49 without any problems. After this the studs 51 break off automatically at the rotating of the LED holder into the working position; the leads 49 can slide through corresponding slots in the holder and holder 47 can be secured to the circuit board with the alignment grooves 52 and be placed in the position indicated in FIG. 7. The knife shaped plug connections 38, the module 45 as well as holder 47 and LEDs 13, and the upper area of the circuit board are covered by a cover 53, which leaves room for the plug unit 4. An attachment screw 54 has its bearing, and is kept from any axial movement, on the opposite side of the pivot 39 and is equipped for the screwing-out of the plug-unit with a counterthread 55 which meshes with the plug strip 35.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the U.S. is:

1. An electrical assembly which is box-shaped and has a frontal cover assembly and a cable connection plug unit having two ends and including a terminal block with cable receiving openings leading to a longitudinal channel, the terminal block having frontally accessible terminal screws for holding cable ends within the receiving openings, the improvement comprising:
   the longitudinal channel being located at the front of the plug unit;
   the cover assembly being adapted to serve as a labeling surface;
   a terminal block comprising a plurality of contacts for making connection to a circuit board in the assembly;
   the circuit board and plug unit being pivotally connected to each other by means for pivoting the plug unit from a position which electrically connects the terminal block and the circuit board to a position which electrically disconnects the terminal block and the circuit board, the means for pivoting being attached to one end of the plug unit and to the circuit board; and
   means for fastening the plug unit to the electrical assembly attached to the plug unit at the other end thereof.

2. The assembly of claim 1 further comprising a removable side panel located on the side of the longitudinal channel opposite the cable receiving openings.

3. The assembly of claim 1 further comprising:
   a plurality of light emitting diodes flanking the longitudinal channel opposite the receiving openings;
   the labeling surface of the cover assembly being located adjacent the light emitting diodes.

4. The assembly of claim 3 comprising a holder for the light emitting diodes.

5. The assembly of claim 1, comprising a frontally accessible module attached to the assembly.

6. The assembly of claim 1 wherein the module is a fuse module.

7. The assembly of claim 5 wherein a sidewall of the module is connected to a contact blade strip by means of a dovetail connection.

8. The assembly of claim 1 wherein the means for fastening comprises an attachment screw placed axially stationarily in a surface located at the other end of the plug unit and which screws into a threaded hole of the assembly.

9. The assembly of claim 3 comprising an insulating material carrier on which the diodes are mounted, the carrier having break-away leg means adapted to hold the diode carrier in place while the diodes are being attached to the circuit board and to then break free when the diodes are swung into their operating position.

* * * * *